United States Patent [19]

Belouet

[11] Patent Number: 5,116,808
[45] Date of Patent: May 26, 1992

[54] TAPE BASED ON A SUPERCONDUCTING OXIDE, AND METHOD OF MANUFACTURE

[75] Inventor: Christian Belouet, Sceaux, France

[73] Assignee: Compagnie Generale d'Electricite, Paris, France

[21] Appl. No.: 501,441

[22] Filed: Mar. 30, 1990

[30] Foreign Application Priority Data

Mar. 31, 1989 [FR] France .................. 89 04251

[51] Int. Cl.⁵ .................................. B32B 9/00
[52] U.S. Cl. ........................... 505/1; 505/701;
505/702; 505/703; 505/704; 428/411.1;
428/457; 428/688; 428/930; 427/62
[58] Field of Search ............... 505/1, 701-704;
428/411.1, 457, 688, 901, 930; 427/62

[56] References Cited

PUBLICATIONS

Crit. Curr. Denities of High Tc Superconductors, IEEE Transactions, vol. 12, No. 4, Dec. 1989, pp. 553-557 Hitotsuyanasi et al.
CA 111 (22): 207093p Maeda et al., 1989.
Japanese Journal of Applied Physics, vol. 27, No. 6, Jun. 1988, pp. L1092-L1093, Tokyo, Japan; T. Konaka et al.: "Preparation of Y-Ba-Cu-O Superconducting Tape by Atmospheric Plasma Spraying".
Patent Abstracts of Japan, vol. 13, No. 92, (E-722), Mar. 3, 1989, p. 108 E 722; & JP-A-63 269 419 (Fujikura Ltd) Jul. 11, 1988.
Japanese Journal of Applied Physics, vol. 27, No. 2, Feb. 1988, pp. L185-L187, Tokyo, Japan; M. Okada et al.: "Fabrication of Ag-Sheathed Ba-Y-Cu Oxide Superconductor Tape".
Patent Abstracts of Japan, vol. 13, No. 68 (E-716), Feb. 16, 1989; JP-A-63 252 318 (Fujikura Ltd) Oct. 19, 1988.

*Primary Examiner*—Patrick J. Ryan
*Attorney, Agent, or Firm*—Sughrue, Mion, Zinn, Macpeak & Seas

[57] ABSTRACT

A tape based on a superconducting oxide containing Cu-O, the tape being characterized by the fact that it comprises a substrate of flexible metal or composite material having a rectangular cross-section and provided on at least one of its faces with a cavity-free film of perovskite type superconducting oxide having congruent or quasi-congruent melting or peritectic decomposition close to a eutectic point, the thickness of said film lying in the range 1 $\mu m$ to 100 $\mu m$, the orientation of the C axis of the superconducting crystals being perpendicular to said face of said substrate.

4 Claims, 1 Drawing Sheet

TAPE BASED ON A SUPERCONDUCTING OXIDE, AND METHOD OF MANUFACTURE

The present invention relates to a tape based on a superconducting oxide and to a method of manufacturing such a tape.

BACKGROUND OF THE INVENTION

At present, wires and tapes based on superconducting oxides for transporting high currents are made by techniques based on shaping these materials in powder form: silkscreen printing, extrusion within a metal sheath, etc. ....

So far, these methods have not been able to reach desired current densities Jc, i.e. Jc $(77K) \approx 10^4$ A/cm$^2$ under zero field. The best of known results are a few $10^3$ A/cm$^2$, generally accompanied by considerable degradation under a magnetic field. Thus, for high temperature superconducting oxides of the Y-Ba-Cu-O, Bi-Sr-Ca-Cu-O and Tl-Ba-Ca-Cu-O types, the values of Jc are very far from the intrinsic values of Jc $(77K) \approx 10^6$ A/cm$^2$ with low sensitivity to magnetic fields as measured on oriented thin films or on monocrystals.

The article "Laser Heated Pedestal Growth of High Tc Bi-Sr-Ca-Cu-O Superconducting Fibers" by D. Gazit and R. S. Feigelson, published in the Journal of Crystal Growth 91 (1988) 318-330, proposes manufacturing a fiber of superconducting oxide having a diameter of 0.1 mm to 1 mm by growth from an extremely fine melt zone. However, such a fiber is very difficult to make.

The same implementation problems arise for structures based on fibers of Cu$_2$O embedded in an oriented matrix of La$_{2-x}$Sr$_x$CuO$_4$ superconducting material as described in the article "Growth and anisotropic magnetic behavior of aligned eutectic type structures in the system La$_{2-x}$Sr$_x$CuO$_4$—Copper oxide" by L. Trouilleux, G. Dhalenne, and A. Revcolevschi—published in the Journal of Crystal Growth 91 (1988) 268-273.

The object of the present invention is to make tapes based on superconducting oxide which are easier to manufacture than wires or fibers known heretofore, and make it possible to achieve high current densities.

SUMMARY OF THE INVENTION

The present invention provides a tape based on a superconducting oxide containing Cu-O, the tape comprising a substrate of flexible metal or composite material having a rectangular cross-section and provided on at least one of its faces with a cavity-free film of perovskite type superconducting oxide having congruent or quasi-congruent melting or peritectic decomposition close to a eutectic point, the thickness of said film lying in the range 1 μm to 100 μm, the orientation of the C axis of the superconducting crystals being perpendicular to said face of said substrate, and the Cu-O planes being oriented in common and parallel to the plane of said face of said substrate.

The thickness of said substrate preferably lies in the range 25 μm to 100 μm.

The texture of the film deposited on the substrate is characterized firstly by the absence of cavities, thereby conferring a density to the fraction of superconducting material in the film which is equal to its intrinsic density. In addition, this texture is characterized by the Cu-O planes of the superconducting crystals being oriented in common and parallel to the plane of the surface of the substrate. These two characteristics taken together make it possible to obtain very high values for the critical current density Jc (77K), similar to that which has already been shown for solid monocrystals of these materials, e.g. Jc $(77K) \approx 10^6$ A/cm$^2$ for Y-Ba-Cu-O.

In a particular embodiment, said perovskite type oxide having peritectic decomposition close to a eutectic point is selected from Bi-Sr-Ca-Cu-O oxides and from compounds of the family Y-Ba-Cu-O where yttrium is replaced by rare earths such as europium or ytterbium. In this case, the film obtained is constituted by two phases, one of which is a continuous superconducting phase.

The invention also provides a method of manufacturing a tape as defined above. In the method, one end of said substrate is immersed in a bath comprising a melt of said superconducting oxide, said substrate is caused to travel upwards at a speed lying in the range 1 cm per minute to 100 cm per minute, and the substrate covered with the crystallized film based on superconducting oxide is then subjected to heat treatment.

At any instant, only a portion of the substrate is immersed. A liquid film of superconducting oxide is continuously deposited by virtue of the bath being continuously fed with an appropriate composition.

BRIEF DESCRIPTION OF THE DRAWINGS

An embodiment of the invention is described by way of example with reference to the accompanying drawings, in which.

DETAILED DESCRIPTION

Figure 1:
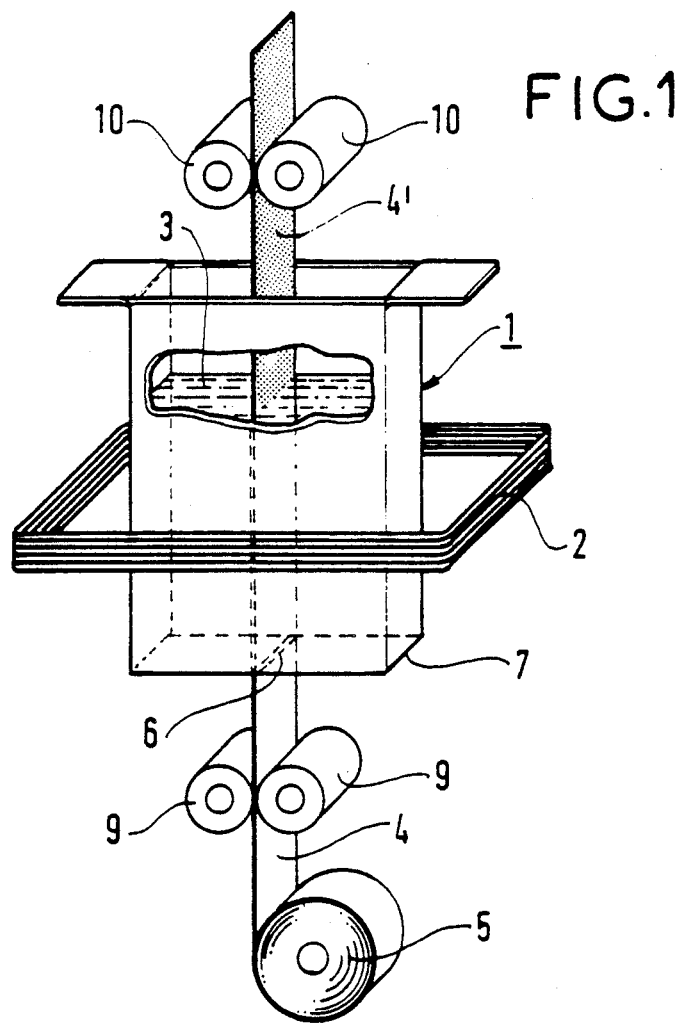
FIG. 1 is a diagram showing the principles of a device enabling the tape manufacturing method of the invention to be implemented.

FIG. 1 shows a crucible 1 associated with heater means 2 and containing a melt of superconducting oxide 3.

Figure 2:
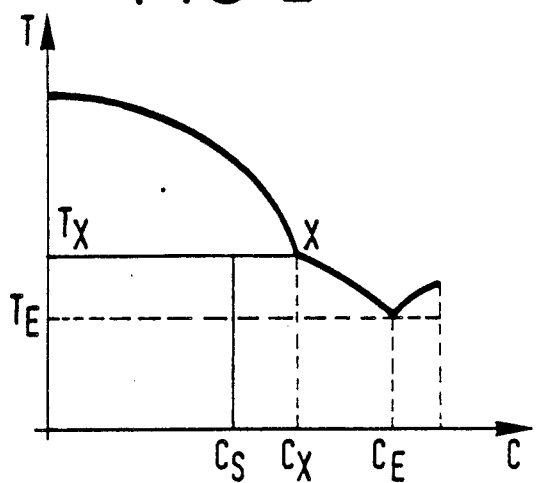
FIG. 2 is a phase diagram (temperature-concentration) of a first compound of the invention.

A superconducting compound is desired having the formula Bi$_2$ Sr$_2$ Ca Cu$_2$ O$_x$. To do this, the bath 3 comprises compounds having the following formulas Bi$_{1.8}$ Sr$_{1.8}$ Ca$_{1.2}$ Cu$_{2.2}$ O$_{8-\delta}$ to Bi$_2$ Sr$_2$ Ca Cu$_2$ O$_8$. The temperature of the bath 3 is about 900° C. It is adjustable under a partial pressure of oxygen in the gas phase. The compound under consideration is a peritectic decomposition compound close to the eutectic point. FIG. 2 is a melt diagram (temperature T, concentration C) of such a compound in which the temperature T$_E$ and the composition C$_E$ of the eutectic point is shown together with the composition C$_S$ of the superconducting material to be crystallized.

A copper tape 4 of width 5 mm and thickness 50 μm and stored on a reel 5 passes through a slot 6 provided in the bottom 7 of the crucible 1. Drive means represented by rollers 9 and 10 drive the tape vertically through the bath 3 at a speed of 1 cm per minute. On leaving the bath, the tape 4' is provided on both faces with a thin film of superconducting oxide, the film having a thickness of about 100 μm.

The operating point X (C$_x$, T$_x$) may be selected using the method proposed by D. Gazit and R. S. Feigelson in the above-mentioned article entitled "Laser Heated Pedestal Growth of High Tc Bi-Sr-Ca-Cu-O superconducting fibers".

During crystallization, the desired superconducting compound appears, having the cationic composition $Bi_2Sr_2CaCu_2$ represented by $C_s$ in the phase diagram of FIG. 2, together with one or more non-superconducting crystal phases such as $SrCaCu_2O_4$.

The resulting tape is then subjected to heat treatment, for example annealing for about 12 hours under oxygen at about 500° C.

This heat treatment is described in detail in the article by T. Iwata et al entitled "Growth of Superconducting Single-Crystal Bi-Sr-Ca-Cu" published in J. Crystal Growth 91 (1988) 282.

The superconducting film obtained after treatment is such that the crystals have their C axis perpendicular to the faces of the substrate. The values of the critical current density Jc at 77K are greater than or equal to $10^4$ A/cm$^2$.

In the example described above, the tape-drawing speed is limited to the diffusion speed of the species crystallizing in the liquid bath 3.

Figure 3:
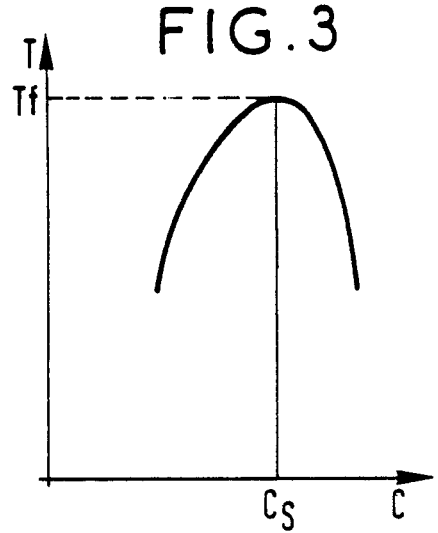
FIG. 3 is a phase diagram for another compound of the invention.

When using a superconducting compound having congruent or quasi-congruent melting, the composition of the bath and the film are identical. FIG. 3 is a sketch showing the corresponding portion of the concentration-temperature diagram. $C_s$ represents the composition of the bath of the desired superconducting compound. The drawing speed is limited only by the need to eliminate the latent heat at the crystallization interface. It may thus typically reach 10 cm/min for a film having a thickness of about 100 μm.

Naturally the drawing speed depends on the thickness of the deposited film and on the characteristics of the substrate.

The invention is not limited to the embodiment described and shown.

I claim:

1. A tape of a superconducting oxide containing Cu-O made by the process comprising the following steps:
   (a) preparing a bath of melted superconducting oxide selected from the group consisting of congruent fusion oxides, quasi-congruent fusion oxide and oxides having peritectic decomposition close to an eutectic point;
   (b) drawing a substrate of flexible metal having a rectangular transversal cross-section through said bath, vertically from bottom to top at a speed between 1 and 100 cm per minute and depositing on at least one of the faces of said substrate a crystallized film of said melted superconducting oxide having a thickness of between 1 μm to 100 μm;
   heat treating said substrate covered with said film, with the orientation of the axis C of the superconducting crystals being perpendicular to said face of said substrate, and the Cu-O planes being oriented in common and parallel to the plane of said face of said substrate, whereby the texture of the film deposited on the substrate is characterized by the absence of cavities therein, thereby conferring a density to the fraction of superconducting material in the film which is equal to its intrinsic density, with the Cu-O planes of the superconducting crystals being oriented in common and parallel to the plane of the face of the substrate resulting in the critical current density Jc of the superconducting film at 77° K. being greater than or equal to $10^4$ A/cm$^2$, and wherein said super conducting oxide is selected from the group consisting of the Bi-Sr-Ca-Cu-O oxides and the compounds of the Y-Ba-Cu-O family where yttrium is replaced by rare earths such as europium or ytterbium.

2. A tape according to claim 1, wherein the thickness of said substrate lies in the range 25 μm to 100 μm.

3. A method of manufacturing a superconducting oxide-based tape containing Cu-O comprising the steps of:
   preparing a bath of melted superconducting oxide selected from the group consisting of congruent fusion oxides, quasi-congruent fusion oxides and oxides having peritectic decomposition close to an eutectic point;
   drawing a substrate of a flexible metallic material having a rectangular transversal cross-section through said bath vertically from bottom to top at a speed of between 1 and 100 cm per minute, and depositing on at least one of the faces of the substrate, a crystallized film of said melted superconducting oxide having a thickness of between 1 μm and 100 μm;
   heat treating said substrate covered with said film, with the orientation of the axis C of the superconducting crystals being perpendicular to said face of the substrate, and with the Cu-O planes being oriented in common and parallel to the plane of said face of said substrate, whereby the texture of the film deposited on the substrate is characterized by the absence of cavities therein, thereby conferring a density to the fraction of superconducting material in the film which is equal to its intrinsic density, with the Cu-O planes of the superconducting crystals being oriented in common and parallel to the plane of the face of the substrate resulting in the critical current density Jc of the superconducting film at 77° K. being greater than or equal to $10^4$ A/cm$^2$, wherein said superconducting oxide is selected from the group consisting of the Bi-Sr-Ca-Cu-O oxides and the compounds of the Y-Ba-Cu-O family where the yttrium is replaced by rare earths such as europium or ytterbium.

4. The method of manufacture in accordance with claim 3, wherein the thickness of said substrate is between 25 μm and 100 μm.

* * * * *